(12) United States Patent
DeLeo et al.

(10) Patent No.: US 8,174,252 B2
(45) Date of Patent: May 8, 2012

(54) METHODS AND SYSTEMS FOR TRANSMITTING AND RECEIVING DATA FROM POINTS ALONG VOLTAGE TRANSMISSION LINES

(75) Inventors: David DeLeo, Sayreville, NJ (US); Franklin Miller, Union, NJ (US)

(73) Assignee: Electronic Technology, Inc., Irvington, NJ (US)

( * ) Notice: Subject to any disclaimer, the term of this patent is extended or adjusted under 35 U.S.C. 154(b) by 503 days.

(21) Appl. No.: 12/394,779

(22) Filed: Feb. 27, 2009

(65) Prior Publication Data

US 2010/0219807 A1 Sep. 2, 2010

(51) Int. Cl.
*G01R 19/00* (2006.01)
*H01Q 1/42* (2006.01)

(52) U.S. Cl. ............... 324/76.11; 343/872; 700/286

(58) Field of Classification Search ............... 324/76.11; 340/572.7; 455/562.1, 575.1, 575.7; 700/286; 343/754, 872, 884
See application file for complete search history.

(56) References Cited

U.S. PATENT DOCUMENTS

| | | | |
|---|---|---|---|
| 5,832,364 A * | 11/1998 | Gustafson | 455/14 |
| 7,633,998 B2 * | 12/2009 | Dockemeyer et al. | 375/220 |
| 7,808,400 B2 * | 10/2010 | McCollough | 340/870.07 |
| 7,812,774 B2 * | 10/2010 | Friman et al. | 343/748 |
| 2007/0139056 A1 * | 6/2007 | Kaneiwa et al. | 324/536 |

* cited by examiner

*Primary Examiner* — Hoai-An D Nguyen
(74) *Attorney, Agent, or Firm* — Stroock & Stroock & Lavan LLP

(57) ABSTRACT

A method of receiving signals transmitted through a voltage carrying power line using an antenna module including the steps of: positioning a housing of the antenna module proximate to the voltage carrying power line such that an antenna being supported in the housing is oriented at an angle with respect to the voltage carrying power line, and receiving a signal via the antenna from the voltage carrying power line.

17 Claims, 3 Drawing Sheets

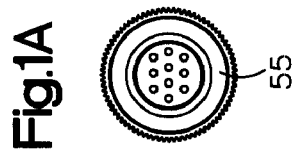
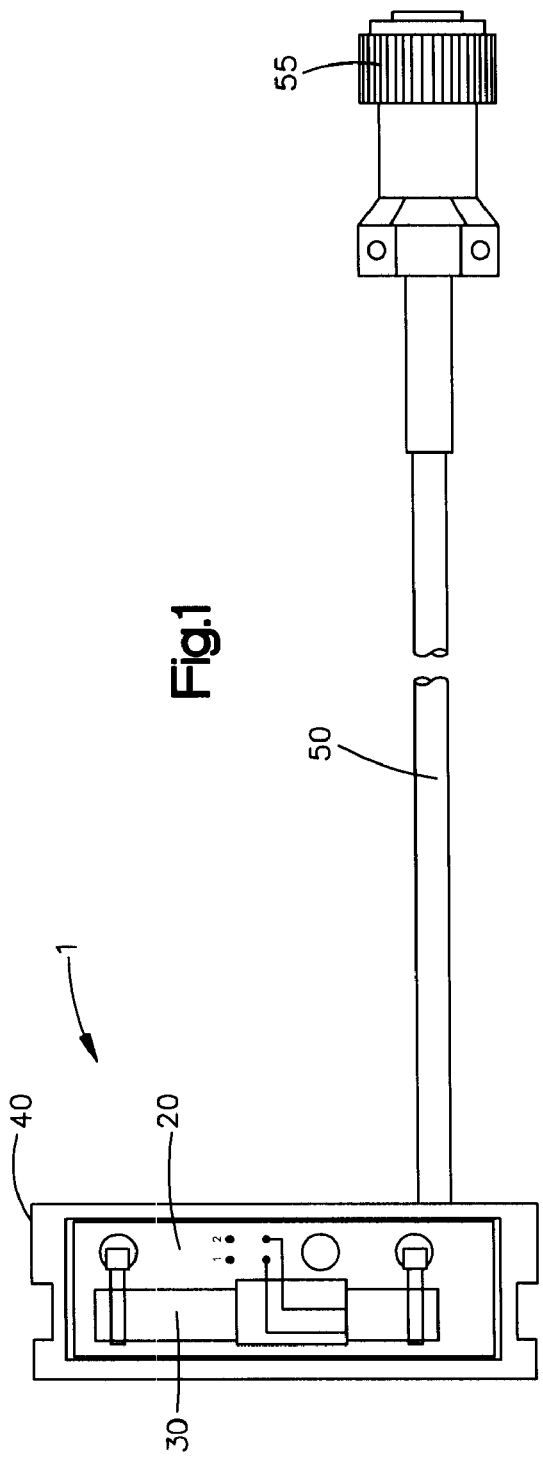
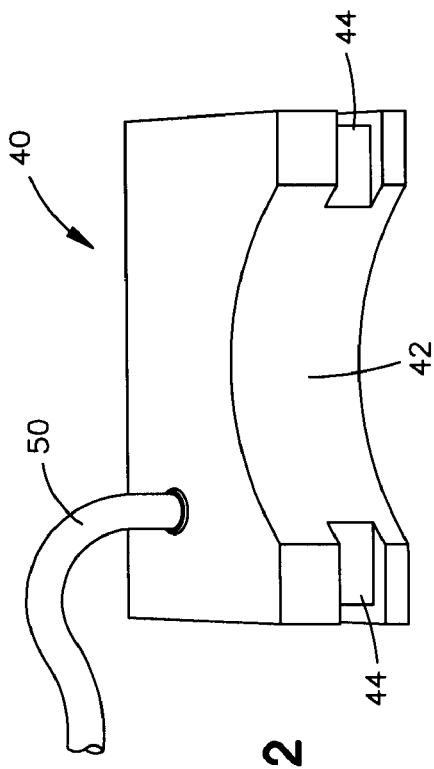

METHODS AND SYSTEMS FOR TRANSMITTING AND RECEIVING DATA FROM POINTS ALONG VOLTAGE TRANSMISSION LINES

FIELD OF THE INVENTION

The present invention is directed to the field of monitoring power distributing networks.

BACKGROUND OF THE INVENTION

In the field of electric utilities there is a need to monitor the status of various aspects of an electrical distribution grid in order to avoid power outages, overloads, and other issues. Currently this may be accomplished through the use of a monitoring system having distributed transmitters located on various network distribution feeders.

Typically, in such a monitoring system a transmitter and sensors are installed at a voltage carrying power line distribution point to be monitored, and a receiver is placed at the network substation (it should be noted that references to a voltage carrying power line refer to cables used for voltage, without mandating that the cables actually carry voltage at all times). The transmitter periodically transmits data, received from the sensors, to the receiver at the substation, through the voltage carrying power line. At the substation, the signal sent by the transmitter is detected by the receiver from the voltage carrying power line. The receiver, which may be part of a computer system further comprising a microprocessor, decodes the signal data and stores the data. A computer system comprising the receiver may also be used to perform various signal data processing to obtain a variety of monitoring functions.

These monitoring systems, while effective, often have from several limitations that result from the signals being transmitted via the voltage carrying power line. For example, the distributed transmitters, generally, blindly transmit their signals through the voltage carrying power line, and as a result frequently interfere with one another, thereby preventing their reception. Furthermore, transmissions via a voltage carrying power line can be disrupted by interruptions in the voltage carrying power line itself (for example from the opening of a breaker at a substation). An embodiment of the present invention seeks to remedy these limitations by providing a method of using an antenna assembly proximate to the voltage carrying power line to permit the transmission of data to and from various points along an electrical distribution grid.

SUMMARY OF THE INVENTION

An embodiment of the present invention is a method of receiving signals transmitted through a voltage carrying power line. The method includes step of positioning a housing of an antenna module proximate to the voltage carrying power line such that an antenna being supported in the housing is oriented at an angle with respect to the voltage carrying power line. The method further includes the step of using the antenna to receive a signal from the voltage carrying power line.

Another embodiment of the present invention is an antenna assembly that includes an antenna module for use with a voltage carrying power line. This antenna module comprises a self-orienting housing disposed proximate to the voltage carrying power line. The antenna module further comprises an antenna that is further supported in the housing and oriented by the housing at an angle, with respect to the voltage carrying power line, that improves the strength of the signal.

A further embodiment of the present invention is an electrical distribution grid monitoring system which includes various embodiments of an antenna assembly. The system comprises power line joints, each of which should enclose at least one voltage carrying power line of the grid. The system further comprises at least one sensor module that generates signals containing status information related to at least one characteristic of the electrical distribution grid. Furthermore, the system preferably includes at least one antenna module that is coupled to at least one power line joint, and in communication with the at least one sensor module. This antenna module preferably includes a housing disposed proximate to the voltage carrying power line and an antenna that receives signals from the sensor module. The antenna is preferably supported in the housing and oriented at an angle of about 70 to 110 degrees with respect to the voltage carrying power line. The antenna module preferably further includes a connector. The electrical distribution grid system additionally includes at least one receiver module that is connected to the connector of the antenna module, and which receives signals through the connector.

BRIEF DESCRIPTION OF THE FIGURES

FIG. 1 is circuit diagram of an exemplary embodiment of the present invention;

FIG. 1A is a front view of a connector of the embodiment shown in FIG 1;

FIG. 2 is a perspective view of an exemplary embodiment of the present invention.

DETAILED DESCRIPTION OF THE INVENTION

Figure 3:
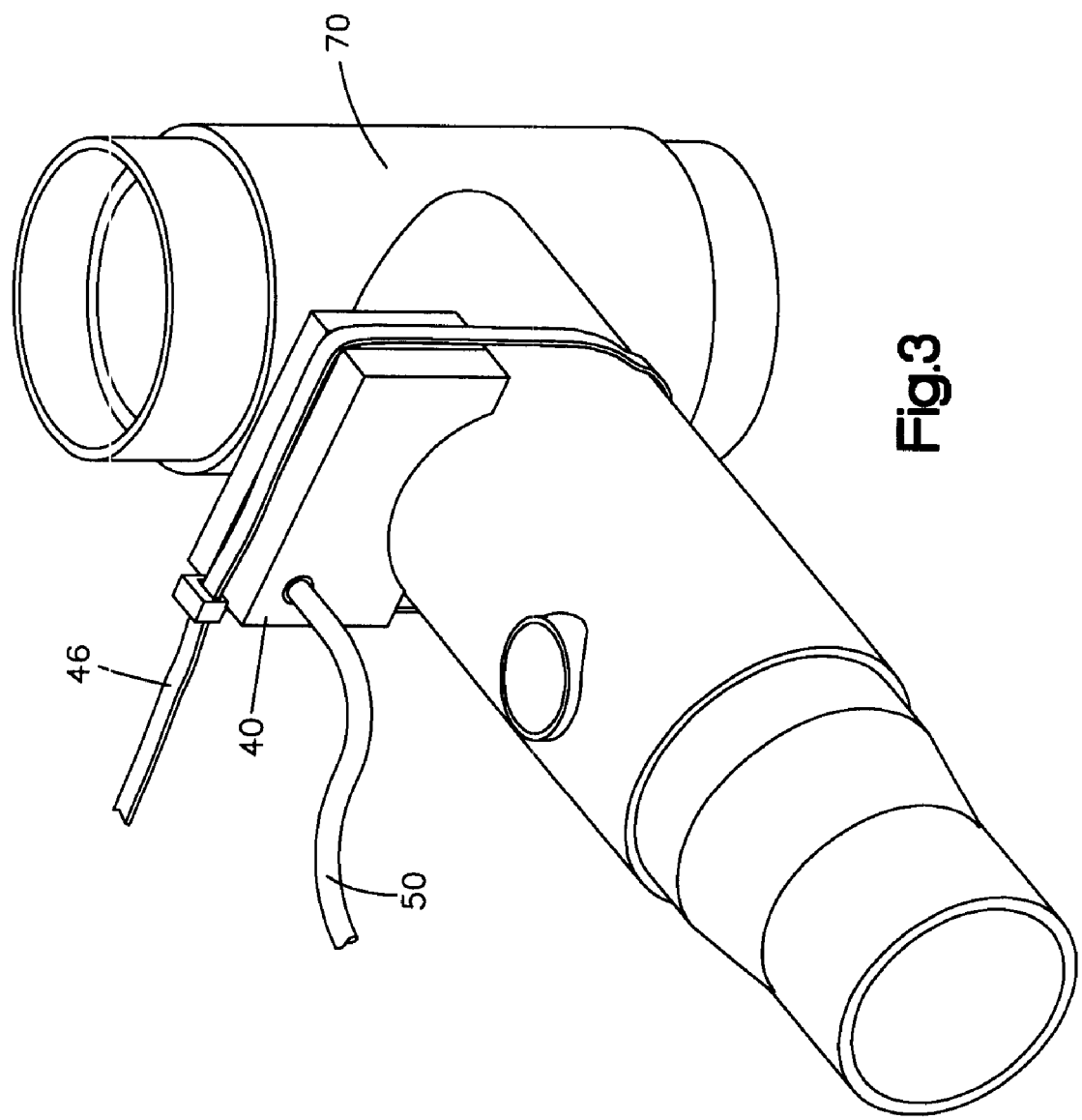
FIG. 3 is a perspective view of an exemplary embodiment of the present invention coupled to a hammerhead insulating connector.

Certain embodiments of the present invention will be discussed with reference to the aforementioned figures, wherein like referenced numerals will refer to like components. It should be noted that references in the specification to phrases such as "one embodiment" or "an embodiment" means that a particular feature, structure or characteristic described in connection with the embodiment is included in at least one embodiment of the invention. The phrases such as "in one embodiment" or "in certain embodiments" in various places in the specification are not necessarily, but can be, referring to the same embodiment.

With reference to FIG. 1, one embodiment of the present invention provides an antenna module generally indicated as 1 supported by a molded housing 40 (FIG. 2), which is preferably self-orienting and which includes and supports an antenna 30 and a circuit board 20, which are coupled together physically (e.g., using cable ties 25) and/or electrically. Further, antenna module 1 may be coupled to external modules (not shown) via a cable 50 and cable connector 55 which extend from the antenna module 1 and are coupled to the circuit board 20 within the housing 40. To stabilize the various components contained within the housing 40, the housing 40 may be filled with epoxy or any other suitable compound.

The housing 40 is generally shaped like a box, although the housing 40 may also be formed in any other suitable shape such as, for example, a hemisphere. The housing 40 may also be constructed from other suitable electrically insulating materials such as, for example, rubber, fiberglass, EPDM, and EPDM Nitrile blends. The housing 40 preferably insulates the circuit board 20 and the antenna 30 from external forces, such as live voltage, that may be present in the vicinity of a voltage carrying power line along which the housing may be oriented.

The antenna 30 that is contained within the housing 40 is preferably a ferrite coil antenna tuned to a frequency range of approximately 40-70 kHz, although any other suitable frequency may be utilized. In various embodiments, antenna 30 may be any type of suitable antenna such as, for example, a Rogowski Coil. In order to improve the performance of the antenna module 1, the antenna 30 is preferably positioned within the housing 40 such that it is substantially perpendicular with respect to the voltage carrying line, although other orientations, for example in the range of 70 to 110 degrees, that permit reception of signals are within the scope of this invention. Specifically, it has been observed that reception of the signal is weakest when the antenna 30 is parallel to the voltage carrying power line, and conversely the signal is strongest as the positioning of the antenna 30 approaches perpendicularity. Accordingly, in a preferred embodiment, the antenna 30 is positioned substantially perpendicular to the voltage carrying power line.

The circuit board 20 that is contained in the housing 40 is preferably a standard printed circuit board that mechanically supports and may electrically connect various electronic components using conductive pathways, or traces. The circuit board 20 supports any suitable elements such as, for example, capacitors, resistors, microprocessors, and/or other elements. Although a single circuit board 20 is shown, multiple circuit boards may also be utilized. In various embodiments it is possible for circuit board 20 to include additional microprocessors, software, and hardware that would permit it to perform additional functions of a sensor, a switch, a transmitter, or other components/devices. In various embodiments the antenna 30 may also be supported in the housing without circuit board 20, by, for example, adhering the antenna 30 to the walls of the housing 40.

The antenna 30 can be connected to an external module (not shown) via cable 50. One end of the cable 50 may be electrically coupled directly to the antenna 30, or indirectly coupled to the antenna 30 via coupling to the circuit board 20. The other end of the cable 50 may be coupled to the external module via cable connector 55. The cable 50 is preferably insulated from external forces, such as live voltage, that may be present. Although a cable 50 is shown and described, in other embodiments it is possible for the antenna module 1 to include components that would permit it to communicate with external modules and devices in any other suitable way, including, but not limited to, wirelessly. In the exemplary embodiment depicted in FIG. 1A, connector 55 is a circular pin connector, although any suitable connector may be utilized within the scope of the invention.

As shown in FIGS. 2 and 3, in an embodiment of the antenna module 1, the antenna module 1 can be oriented along a hammerhead insulating joint 70 that receives voltage carrying power lines (not shown) that are part of an electrical voltage distribution network. To improve performance of the antenna module 1, the housing 40 is preferably self-orienting as a result of being constructed with structural elements that ensure proper positioning of the antenna module 1 relative to the joint 70 and thus, the voltage carrying power line. The housing 40 can include a concave surface 42 that is sized and configured such that concave surface 42 fits flush with the circular cross-section of the joint 70 in a self-aligning orientation (e.g., antenna 30 of the antenna module 1 is substantially perpendicular to the voltage carrying power line). Although a concave surface 42 is shown, any of a variety of structural components may be used to achieve proper positioning, for example, matching protrusions and concave surfaces on the joint 70 and the housing 40 that fit in a dovetail configuration, matching holes on the joint 70 and the housing 40 through which pegs or screws could be fitted, or any other self-aligning structure.

To secure the antenna module 1 in its proper orientation relative to the voltage carrying power line, antenna module 1 can be fixedly coupled to joint 70. This may be accomplished through grooves 44 which are sized and configured with an opening therethrough to receive coupling element 46, such as a cable tie. In further embodiments, any other permanent or temporary coupling element or method may be used, for example, adhesive or VELCRO® straps.

Figure 4:
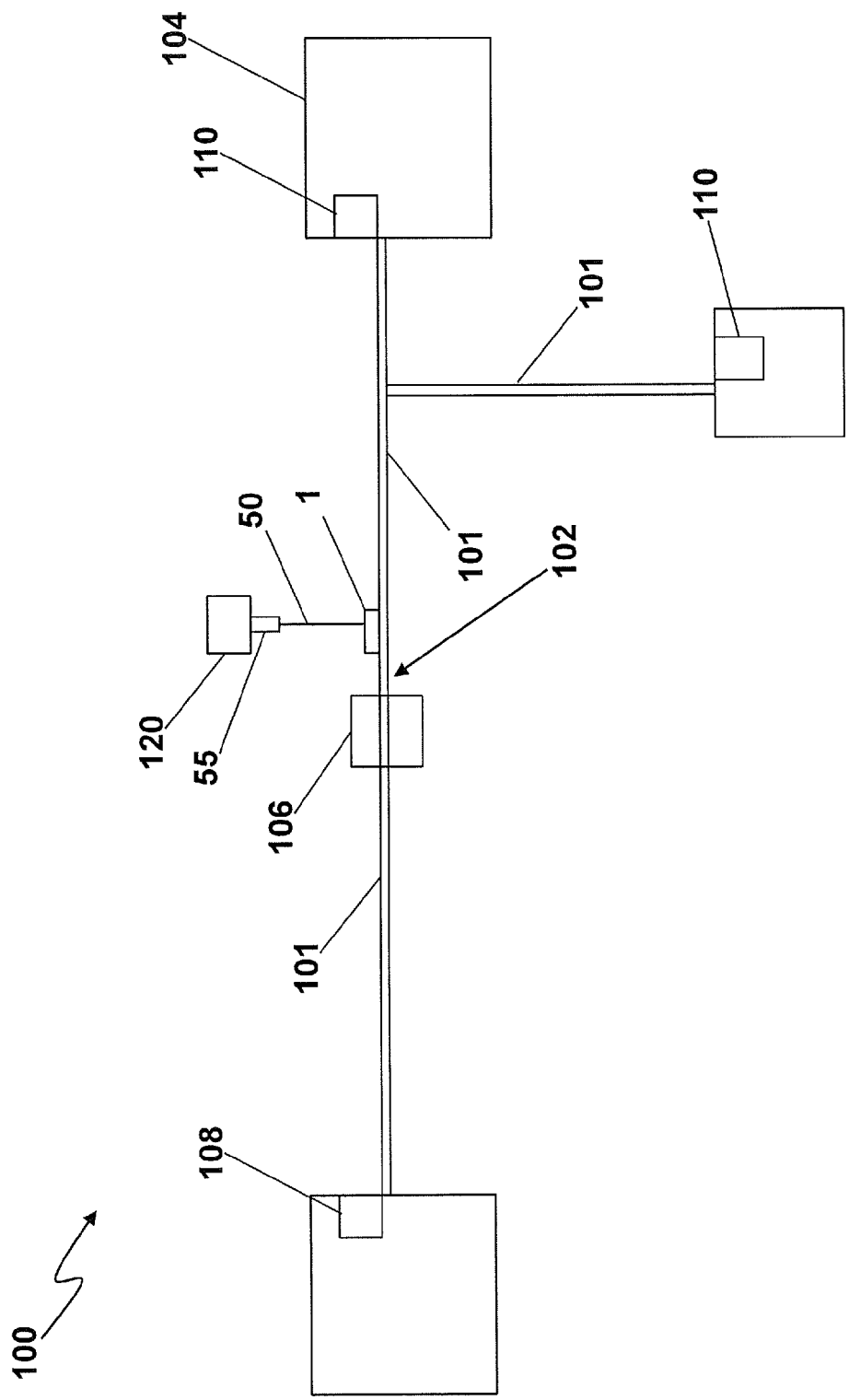
FIG. 4 is a block diagram of a system for monitoring an electrical distribution grid in accordance with an embodiment of the invention.

In use, such as shown in FIG. 4, antenna module 1 can be utilized in combination with further modules to create an improved electrical distribution grid monitoring system 100. By way of non-limiting example, antenna modules 1 in combination with portable modules 120, such as miniaturized substation receivers, can be used to receive signals from the voltage carrying power line 101 proximate to which the antenna module 1 is disposed.

The signals to be received by and through antenna modules 1 may be sent via the voltage carrying power line 101 by various sensors 110 or modules attached to different points in the electrical distribution grid 100. For example, if a sensor module 110 is used to monitor a network protector 104, such sensor module 110 could be configured to periodically transmit signals carrying status information such as the network voltage, load, position of the switch at the network protector, 100, and temperature, pressure and level of oil at the network protector 110. If there was a disruption in the voltage carrying power line 101, for example due to an opening of a feeder breaker, 106, the signals sent by the sensor 110 could be precluded from being received by a substation receiver 108. Unlike the prior art systems, where these signals would be lost until the disruption was resolved, antenna module 1 enables immediate reception of those signals at a pre-disruption position 102 along electrical distribution grid 100. For example, a utility worker could bring and connect a miniaturized substation receiver 120 to the cable connector 55 of cable 50 of antenna module 1 that is located at a pre-disruption position 102 in the electrical distribution grid 100. The miniaturized substation receiver 120 would then receive, through the antenna module 1, the signal sent by the sensor module 110 and also other signals sent by other sensor modules 110 that are located along the same voltage carrying power line 101 prior to the disruption point 102.

In other embodiments an electrical grid monitoring system may be improved through the use of antenna module 1 together with remote transceiver module which is capable of sending signals as well receiving them; such module is disclosed in a co-pending application Ser. No. 12/394,622, filed Feb. 27, 2009 and assigned to the same assignee as this patent. In such a system, a sensor module located at a network protector can send a signal containing relevant information via the voltage carrying power line. This signal could then be received by an antenna module 1 and extracted by the remote transceiver module which is connected to the antenna module 1 through cable connector 55 of cable 50. The transceiver module may then processes this information and forward the information signal through a connection to an external network (and/or the voltage carrying power line), to a receiver module at a power substation or control center. An operator of the receiver module may respond to the information received. The operator has the option to issue a command to open the network protector. If the operator issues such a command signal, it may be sent via a voltage carrying power line, or an external network, to the a relevant module that is in communication with another antenna module 1, such relevant module may be the sensor module or another module, which in turn may be a remote transceiver module. This relevant module, upon receiving the command signal, either through the voltage carrying power line via antenna module 1, or through an external network, then opens the network protector.

Because antenna module 1 permits reception of signals at various points along the electrical distribution grid, data may be received and utilized even if there is a disruption in the electrical distribution grid between the sensor on the network protector and the receiver located at a power substation. It is envisioned that an array or arrays of antenna modules 1 could be created so that data may be received at any one of those locations, and so that such data can be transmitted to a final destination through an external network using a transmitting module such as a transceiver (which receives the information through the antenna modules).

In a further embodiment, it is envisioned that antenna modules 1 can be combined with various modules, hardware, microprocessors and software to create an automated monitoring system where such antenna modules 1 are used to relay information signals and command signals between various points along the electrical distribution grid to effectively manage the entire power network by automatically (or due to user input) performing actions such as rerouting power and switching of network protectors. Such systems would not be possible with conventional devices because of their limits due to the conventional monitoring systems' inability to retrieve information if a power-line is interrupted and their uni-directional capability.

It will be further appreciated by those skilled in the art that the figures are purely illustrative, and that the device may be implemented in any number of ways, as long as the functionality, relating to the ability of the antenna to receive data related to an electrical distribution grid while being in close proximity to voltage carrying power line joints, remains the same.

What is claimed is:

1. A method of receiving data signals transmitted through a voltage carrying power line of an electrical distribution grid using an antenna module including the steps of:
    coupling a housing of the antenna module to an insulating member receiving the voltage carrying power line such that an antenna being supported in the housing is communicatively coupled to the voltage carrying power line; and
    using the antenna to receive a data signal carried on the voltage carrying power line, the data signal generated by a sensor monitoring the electrical distribution grid.

2. The method of claim 1, wherein the antenna module includes a connector and the method comprises:
    coupling a module to the connector; and
    receiving the data signal with the module from the antenna module through the connector.

3. The method of claim 2, wherein the method comprises transmitting a second data signal in response to the data signal received from the antenna module.

4. The method of claim 1, wherein the data signal comprises information related to at least one of voltage information, electrical load information, and network protector information.

5. An antenna module for use with a voltage carrying power line of an electrical distribution grid comprising:
    a self-orienting, insulative housing configured to mechanically couple with an insulative member receiving the voltage carrying power line;
    an antenna being disposed and supported in the self-orienting housing and oriented by the self-orienting housing at an angle with respect to the voltage carrying power line that improves the strength of a data signal carried on the voltage carrying power line, the data signal generated by a sensor monitoring the electrical distribution grid.

6. An antenna module of claim 5 wherein the antenna is disposed at an angle substantially in the range of 70 to 110 degrees with respect to the voltage carrying power line.

7. An antenna module of claim 5 comprising a circuit board that is disposed and supported in the self-orienting housing, that is coupled to the antenna.

8. The antenna module of claim 5, wherein the self-orienting housing includes a concave surface corresponding to the shape of a voltage carrying power line joint.

9. The antenna module of claim 5, wherein the antenna is a ferrite coil antenna.

10. The antenna module of claim 5, wherein the signals are signals having a frequency in the range from 40 kHz to 70 kHz.

11. The antenna module of claim 5, wherein the antenna module further comprises a cable that is electrically coupled to the antenna and extends outside the self-orienting housing.

12. The antenna module of claim 5, wherein the self-orienting housing is molded from an electrically insulating material.

13. An antenna module of claim 5 wherein the antenna is substantially perpendicular with respect to the voltage carrying power line.

14. The antenna module of claim 5 wherein the antenna module is further configured to receive a data signal comprising information related to at least one of voltage information, electrical load information, and network protector information.

15. A system of monitoring an electrical distribution grid of voltage carrying power lines comprising:
    at least one power line joint enclosing at least one voltage carrying power line of the electrical distribution grid;
    at least one sensor module that generates data signals containing status information related to at least one characteristic of the electrical distribution grid;
    at least one antenna module that is coupled to the power line joint, and in communication with the at least one sensor module via the at least one voltage carrying power line, the at least one antenna module including,
        a housing disposed proximate to the at least one voltage carrying power line,
        an antenna that receives the data signals carried on the voltage carrying power line from the sensor module, the antenna supported in the housing and oriented at an angle with respect to the at least one voltage carrying power line, wherein the angle is in the range of about 70 to 110 degrees, and
        a connector; and
    at least one receiver module that is connected to the connector and receives signals through the connector.

16. The system of claim 15, wherein the at least one antenna module is a plurality of antenna modules, the antenna modules are configured to relay signals for one another.

17. The system of claim 15, wherein the data signals comprise information related to at least one of voltage information, electrical load information, and network protector information.

* * * * *